(12) United States Patent
Tung et al.

(10) Patent No.: US 6,220,771 B1
(45) Date of Patent: Apr. 24, 2001

(54) WAFER BACKSIDE PROTECTION APPARATUS

(75) Inventors: Fu-Ching Tung, Hisnchu; Hong-Ming Chen, TaiNan; Wu-Lang Lin, TaiChung; Chia-Ming Chen, ChangHua; Jen-Rong Huang, Hsinchu, all of (TW); Peter L. Mahneke, Bucholz (DE); Janathan Wang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/461,349

(22) Filed: Dec. 15, 1999

(30) Foreign Application Priority Data

Sep. 15, 1999 (TW) .................................. 88215788

(51) Int. Cl.$^7$ ...................................... G03D 5/00
(52) U.S. Cl. ............................. 396/611; 396/627; 118/52; 427/240
(58) Field of Search ..................................... 396/604, 611, 396/627; 118/52, 54, 320, 321, 666, 667, 712, 715; 134/2, 3, 157, 902; 430/325, 330, 311, 312; 156/345; 427/240

(56) References Cited

U.S. PATENT DOCUMENTS

| | | | |
|---|---|---|---|
| 5,159,374 | * | 10/1992 | Groshong .............................. 396/611 |
| 5,689,749 | * | 11/1997 | Tanaka et al. ........................ 396/611 |
| 6,027,602 | * | 2/2000 | Hung et al. ........................... 156/345 |

* cited by examiner

*Primary Examiner*—D. Rutledge
(74) *Attorney, Agent, or Firm*—Dougherty & Troxell

(57) ABSTRACT

A wafer backside protection apparatus includes a motor, a vacuum chuck, an annular seat and a top cover. The motor has an output shaft upon which the chuck is mounted. The chuck has a front surface to suck and hold a wafer from its backside. The chuck has a backside in which a water guard ring and a plurality of slant bores are formed. The slant bores run from the water guard ring through the wafer front surface. The annular seat is located below the chuck and has two symmetrical slant nozzles projecting toward motor rotating direction for ejecting protection liquid to the water guard ring. Protection liquid may be spun and splashed out through the slant bores to form a protection liquid film between the chuck and the wafer backside due to centrifugal force resulting from chuck and wafer rotation driven by the motor. The protection liquid film may protect wafer backside from chemical erosion and contamination resulting from wafer production process.

17 Claims, 4 Drawing Sheets

WAFER BACKSIDE PROTECTION APPARATUS

FIELD OF THE INVENTION

This invention relates to a wafer backside protection apparatus and particularly to a protection apparatus that forms a protection liquid film on the wafer backside.

BACKGROUND OF THE INVENTION

In a semiconductor manufacturing process, a bare wafer has to go through hundred of processes to form integrated circuits to function as desired. The processes include coating photoresist, photo developing, depositing and etching. These processes are targeted on the front side of the wafer. Even planarization and cleaning processes focus only the front side. The wafer backside has rarely been protected. However in the processes set forth above, wafer backside also has chance being eroded by chemicals, contaminated by photoresist residuals or other exhaust particles. All this has negative impact on wafer quality and may reduce process yield.

There is a prior art disclosed in U.S. Pat. No. 5,689,749 for protecting wafer backside. FIGS. 1 and 2 show its general structure. It includes a motor 33, a chuck 21 and an annular seat 26.

The motor 33 is mounted on an elevator mechanism 34 and has an output shaft 14 to provide a rotation power source. The elevator mechanism 34 may drive the motor 33 up or down.

The chuck 21 has a vacuum suction means (not shown in the figures) in the center for sucking and holding the backside of the wafer W. The annular seat 26 is located below the wafer W and surrounds the chuck 21. On the annular seat 26, there is mounted a water guard ring 42 which has a top rim adjacent the wafer backside. The top rim has a specially formed inner ring 40b and an outer ring 40a. In the annular seat 26, there are also a pair of nozzles 32 symmetrically located. Outside the annular seat 26, there is an annular chamber wall 20. The nozzles 32 have their ejection openings facing the water guard ring 42 and may eject protection liquid (such as D.I. water). The chamber wall 20 may shield the process chamber from the outside environment.

In the process chamber above the wafer W, there are nozzle heads 23 and 31 for providing reaction agent needed for semiconductor manufacturing process.

When a robot arm (not shown in the figures) moves the wafer W into the process chamber, the elevator mechanism 34 drives the chuck 21 to suck and hold the wafer W and moves the wafer W to an initial position. The motor 33 and the output shaft 14 then drive the chuck 21 and the wafer W to rotate. The nozzle heads 23 and 31 eject reaction agent on the wafer W surface. Because of centrifugal force, the reaction agent on the water surface will be spun out. Some of the reaction agent will hit the chamber wall 20 and rebound on wafer backside.

In order to prevent the backside of the wafer W from contamination by the reaction agent, the nozzles 32 will eject protection liquid to the water guard ring 42. As the top end of the water guard ring 26 adjacent the wafer backside, when the water guard ring 26 fills with the protection liquid and spills over, the rotating wafer W will pickup some protection liquid to form a protection liquid film around the inner ring 40b (or outer ring 40a). This liquid film may protect the wafer backside from outside contamination.

However the prior art set forth above has complex components and forms. They are difficult to produce and assemble. The production cost is higher. It also does not provide a closed process environment and is prone to contamination. Furthermore, ejection of protection liquid from the nozzles 32 requires high pressure and often results in return splashing of the protection liquid. This will weaken the suction force of the chuck 21 to the wafer W. The strong liquid impact could even break the wafer W.

In the semiconductor industry, there are some other techniques have been developed to address this issue, using gas film (such as nitrogen gas film) to fill the gap between the wafer backside and the annular seat is one of such techniques. However gas film is not effective to provide a closed process environment. There is still room for improvement regarding the issue of wafer backside protection.

SUMMARY OF THE IVNENTION

It is an object of this invention to provide a wafer backside protection apparatus that uses protection liquid film to protect wafer backside from contamination. The apparatus not only offers a closed process environment, it also may prevent the wafer from breaking. It may be used for the processes such as coating, spin drying, brush scrubber, etching, chemical mechanical polishing, vaporizing or single wafer spin cleaning and the like.

The apparatus according to this invention includes a motor, a vacuum suction chuck, an annular seat and a top cover. The motor has an output shaft for providing output rotation drive. The chuck is mounted on the motor and has a front side for sucking and holding the wafer backside. The backside of the chuck has a water guard ring and a plurality of fine slant bores running from the water guard ring to the front side of the chuck. The annular seat is located below the chuck and has two symmetrical slant nozzles for ejecting protection liquid toward the motor rotating direction at an elevation angle. The top cover covers the top of the chuck to form a closed process chamber.

In this invention, the slant nozzles continuously eject protection liquid to the water guard ring. The motor drives the chuck and wafer to rotate synchronously.

On the other hand, the nozzle slant angle is pointing to the motor rotation direction, therefore protection liquid may be ejected on the wafer backside with less return splashing and may prevent liquid waste and wafer breaking. When the nozzles continuously eject protection liquid to the water guard ring, the chuck is rotated by the motor. The centrifugal force of the water guard ring may spin protection liquid through the slant bores to the water backside to form a protection film to protect wafer backside.

BRIEF DESCRIPTION OF THE DRAWINGS

The invention, as well as its many advantages, may be further understood by the following detailed description and drawings in which.

DETAILED DESCRIPTION OF THE PREFERRED EMBODIMENT

Figure 1:
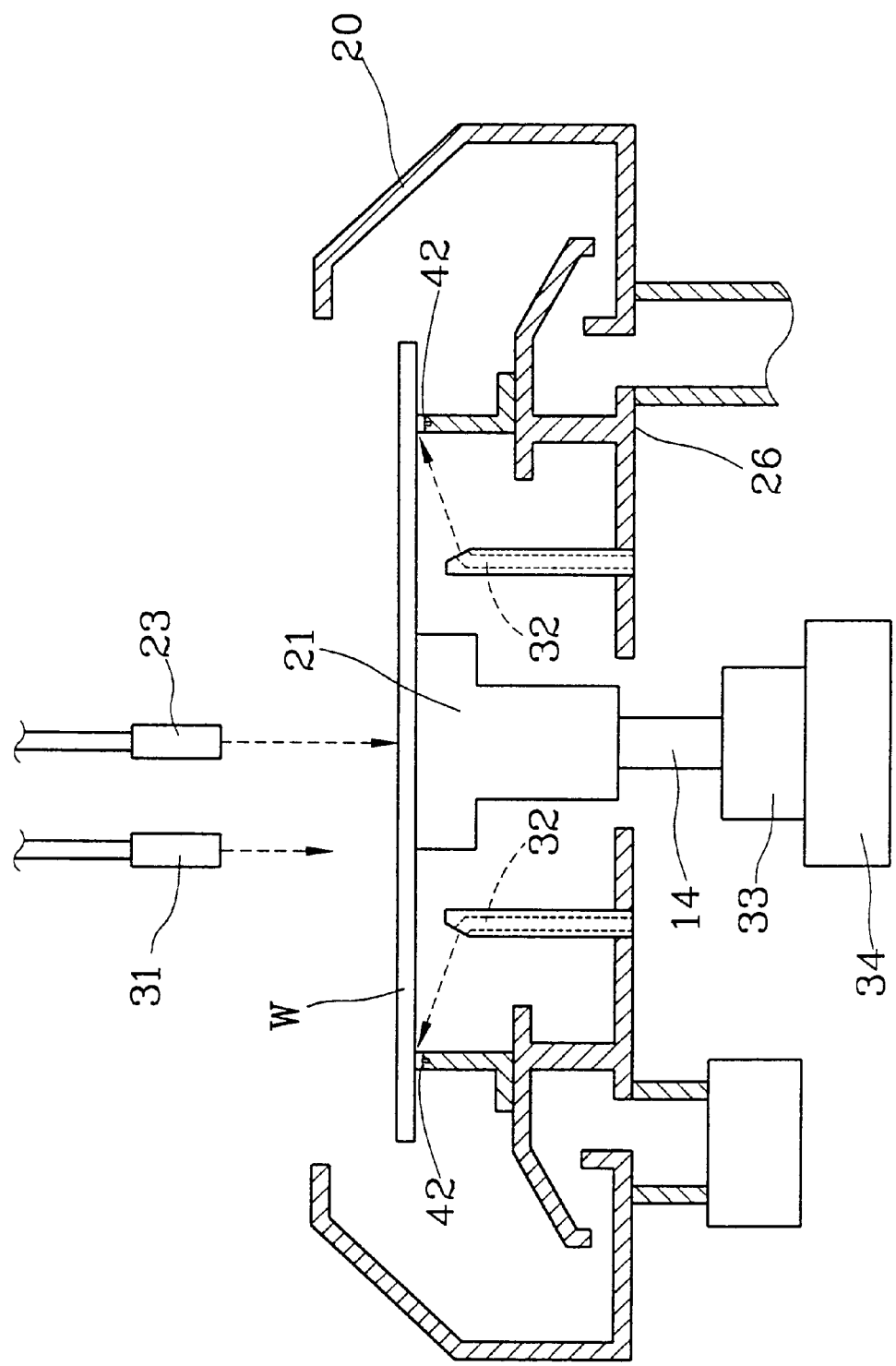
FIG. 1 is a schematic side view of a conventional wafer backside protection apparatus.
Figure 2:
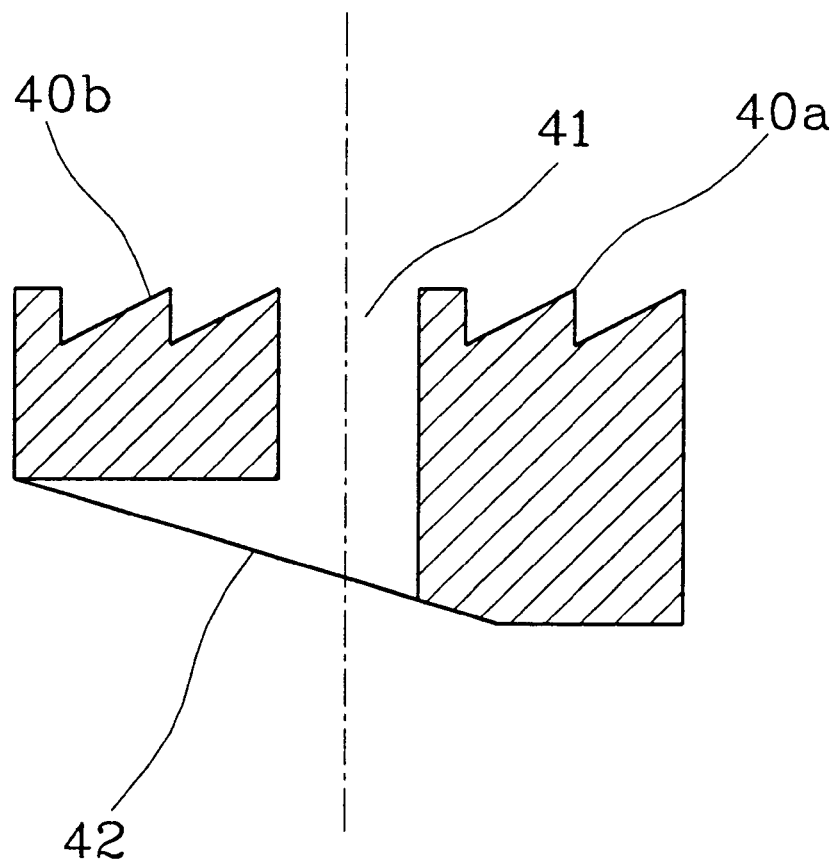
FIG. 2 is a fragmentary sectional view of the conventional apparatus shown in FIG. 1.
Figure 3:
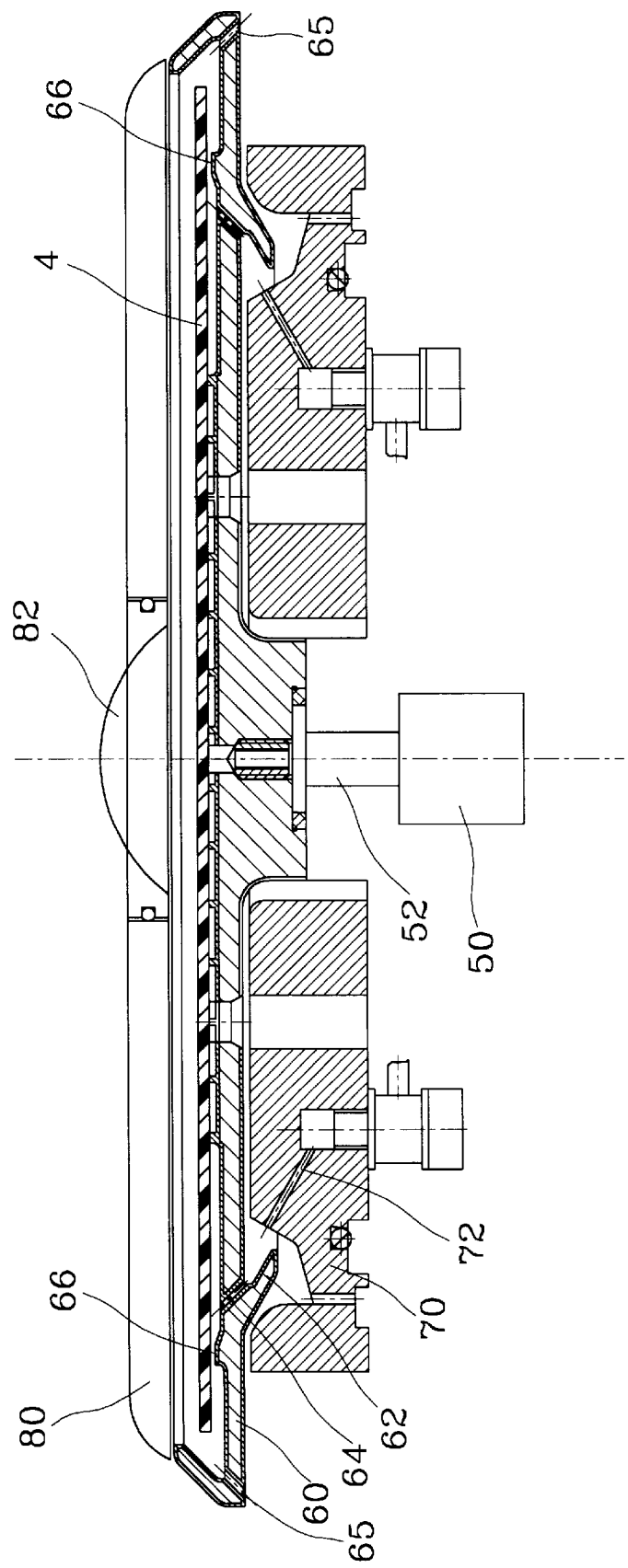
FIG. 3 is a sectional view of this invention.
Figure 4:
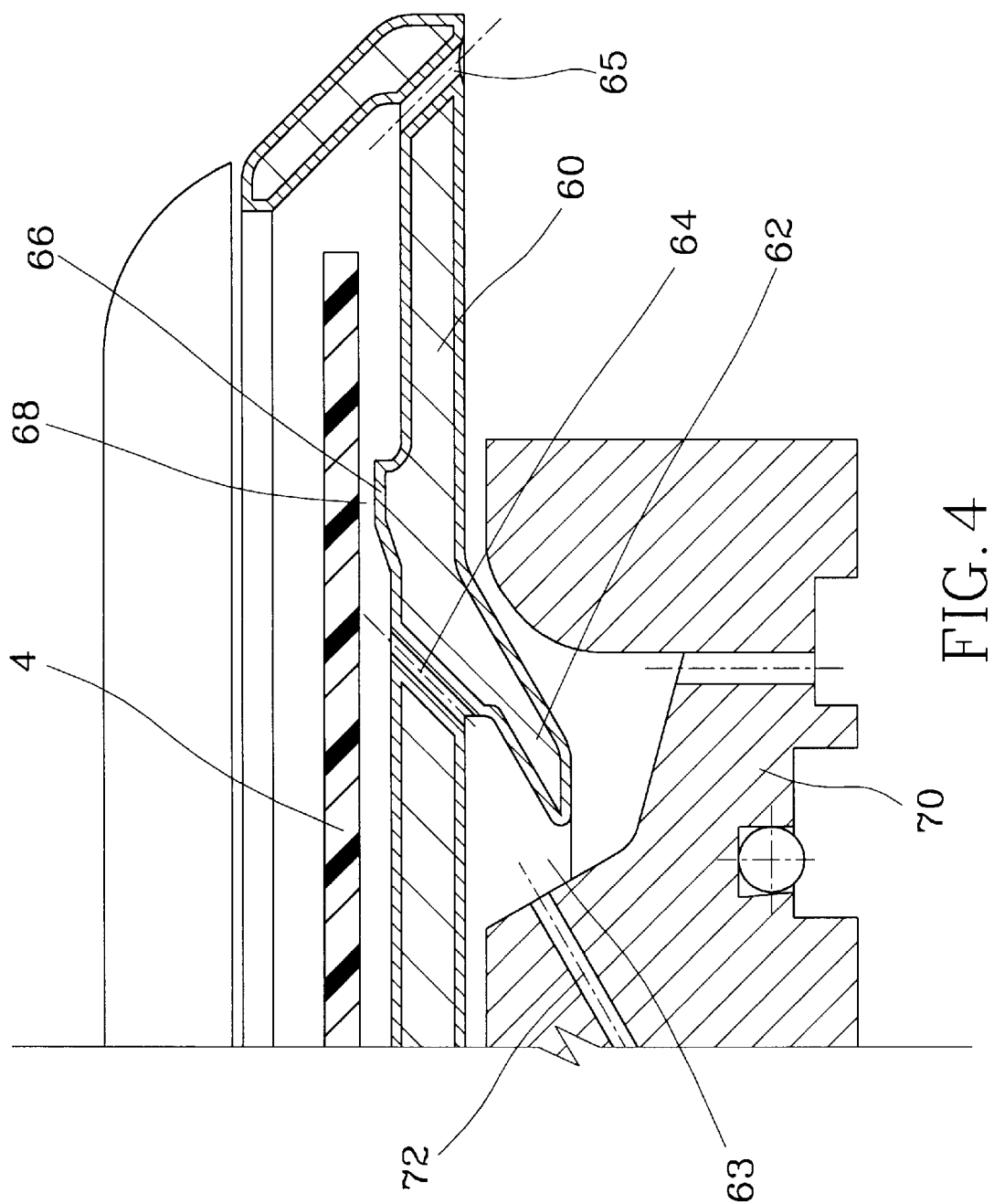
FIG. 4 is a fragmentary sectional view of this invention shown in FIG. 3.

Referring to FIGS. 3 and 4, the wafer backside protection apparatus of this invention includes a motor 50, a chuck 60, an annular seat 70 and a top cover 80. The motor 50 has an output shaft 52 for output rotation drive force and is mounted on a frame. The wafer 4 is held and supported by a wafer supporting means (not shown in the figure). The backside of the chuck 60 is mounted on the output shaft 52 so that the chuck 60 and the motor 50 may be rotated synchronously. The front side of the chuck 60 has a vacuum suction means for sucking and holding the backside of the wafer W. In the backside of the chuck 60, there is a water guard ring 62 and a plurality of fine and slant bores 64 radically formed and running from the water guard ring 62 to the front side of the chuck 60. The number of the slant bores 64 is preferably sixty with an angular interval of six degrees between every two neighboring slant bores. The water guard ring 62 may hold protection liquid in a liquid collection zone 63 formed thereunder. There is an annular bulge ring 66 formed on the top surface of the chuck 60 under the wafer backside.

The annular seat 70 is located above the frame and below the chuck 60 and surrounds the motor 50 at a higher position. It has a pair of slant nozzles 72 projecting toward the motor rotation direction at an elevation angle which is preferably sixty degree. The position and ejection speed of the nozzles 72 are coordinated to enable the protection liquid be ejected smoothly into the liquid collection zone 63.

The top cover 80 may be moved up or down, and to form a closed process chamber with the chuck 60. There may be a nozzle head 82 in the top cover 80 for introducing chemicals into the process chamber to perform required reaction with the wafer 4. The top cover 80 may also be made rotationable in synchronous with the rotation of the chuck 60 to avoid creating static electricity between the top cover 80 and the chuck 60.

When in use, a robot arm (not shown in the figures) moves the wafer 4 into the reaction chamber. The elevator mechanism (not shown in the figures) moves up to suck and hold the backside of the wafer 4, then moves down to the chuck 60 which in turn sucks and holds the wafer 4 while the suction force of the elevator mechanism is released.

Then the top cover 80 moves down to cover the chuck 60 and the nozzle head 82 provides reaction agent on the wafer 4 for reaction process. The reaction agent is spun and splashed outward due to centrifugal force resulting from wafer rotation driven by the motor 50. In order to protect the backside of the wafer 4 from contamination by the reaction agent, the nozzles 72 will be activated to eject protection liquid (such as D.I. water) to the water guard ring 62. As the motor 50 also drives the chuck 60 and wafer 4 rotating synchronously, the protection liquid held in the liquid collection guard 63 will be spun and ejected to the wafer backside which is exposed outside the chuck 60 through the slant bores 64 to form a protection liquid film 68 between the wafer backside and the bulge ring 66. Part of the protection liquid also will be splashed out from the protection liquid film 68 to protect the wafer 4 outer rim . Thus the backside of the wafer 4 will be shielded from contamination by the reaction agent coming from the wafer front side. Used protection liquid and gas may be discharged out through outlet holes 65 formed at an outer rim of the chuck 60.

The main difference between this invention and the conventional art is that the slant bores 64 are tilted at an elevation angle (about sixty degrees) pointing to the motor rotation direction for ejecting protection liquid into to water collection zone 63. Protection liquid may be held in the collection zone 63 with less return splash or loss. Furthermore the protection liquid film formed between the slant bores 64 and the bulge ring 66 enables the wafer 4 to receive less impact from the ejection of the protection liquid, and may reduce wafer breaking probability.

When the nozzles 72 eject protection liquid to the liquid collection zone 63, the centrifugal force resulting from the rotating chuck 60 and motor 50 also helps to spread the protection liquid to the wafer backside to form a protection liquid film to protect the wafer backside.

It may thus be seen that the objects of the present invention set forth herein, as well as those made apparent from the foregoing description, are efficiently attained. While the preferred embodiment of the invention have been set forth for purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. A wafer backside protection apparatus, comprising;
   a motor having an output shaft providing output rotation drive;
   a chuck mounted on the output shaft and formed with a water guard ring having a plurality of fine slant bores for protection liquid held in the water guard ring to eject out through the slant bores due to centrifugal force resulting from the rotating chuck and wafer driven by the motor; and
   an annular seat fixedly located below the chuck and having two symmetrical slant nozzles for ejecting protection liquid to the water guard ring, wherein number of the slant bores is between 40 and 70, and the slant bores are spaced from one another by six degrees angularly.

2. The wafer backside protection apparatus of claim 1, wherein the motor is fixedly mounted on a frame and the wafer is movable up or down by an elevator mechanism.

3. The wafer backside protection apparatus of claim 1, wherein the chuck further comprises a suction head to suck and hold a wafer by means of vacuum force.

4. The wafer backside protection apparatus of claim 1, wherein the slant bores are formed radically and spaced equally around the chuck.

5. The wafer backside protection apparatus of claim 1, wherein the slant nozzles are tilted at an elevation angle of sixty degrees.

6. The wafer backside protection apparatus of claim 1, wherein the slant nozzles are tilted at sixty degrees from horizontal and project toward a direction of motor rotation.

7. The wafer backside protection apparatus of claim 1, wherein the protection liquid is D.I. water.

8. The wafer backside protection apparatus of claim 1, wherein the water guard ring further comprises a liquid collection zone for collecting protection liquid being ejected to the water guard ring.

9. The wafer backside protection apparatus of claim 1, wherein a protection liquid film is formed between the chuck and wafer backside.

10. A wafer backside protection apparatus, comprising;
    a motor having an output shaft providing output rotation drive;
    a chuck mounted on the output shaft and formed with a water guard ring having a plurality of fine slant bores for protection liquid held in the water guard ring to eject out through the slant bores due to centrifugal force resulting from the rotating chuck and wafer driven by the motor, wherein the water guard ring has a liquid collection zone for collecting protection liquid being ejected to the water guard ring; and an annular seat fixedly located below the chuck and having two symmetrical slant nozzles for ejecting protection liquid to the water guard ring.

11. The wafer backside protection apparatus of claim 10, wherein the motor is fixedly mounted on a frame and the wafer is movable up or down by an elevator mechanism.

12. The wafer backside protection apparatus of claim 10, wherein the chuck further comprises a suction head to suck and hold a wafer by means of vacuum force.

13. The wafer backside protection apparatus of claim 10, wherein the slant bores are formed radically and spaced equally around the chuck.

14. The wafer backside protection apparatus of claim 10, wherein the slant nozzles are tilted at an elevation angle of sixty degrees.

15. The wafer backside protection apparatus of claim 10, wherein the slant nozzles are tilted at sixty degrees from horizontal and project toward a direction of motor rotation.

16. The wafer backside protection apparatus of claim 10, wherein the protection liquid is D.I. water.

17. The wafer backside protection apparatus of claim 10, wherein a protection liquid film is formed between the chuck and wafer backside.

\* \* \* \* \*